(12) United States Patent  
Bauer et al.

(10) Patent No.: US 7,656,018 B2
(45) Date of Patent: Feb. 2, 2010

(54) PACKAGE FOR AN ELECTRONIC COMPONENT AND METHOD FOR ITS PRODUCTION

(75) Inventors: Michael Bauer, Nittendorf (DE); Jens Pohl, Bernhardswald (DE)

(73) Assignee: Infineon Technologies AG, Neubiberg (DE)

( * ) Notice: Subject to any disclaimer, the term of this patent is extended or adjusted under 35 U.S.C. 154(b) by 234 days.

(21) Appl. No.: 11/444,530

(22) Filed: Jun. 1, 2006

(65) Prior Publication Data

US 2006/0273443 A1    Dec. 7, 2006

(30) Foreign Application Priority Data

Jun. 1, 2005    (DE) ................... 10 2005 025 543

(51) Int. Cl.
*H01L 23/24* (2006.01)
(52) U.S. Cl. ..................................... 257/687
(58) Field of Classification Search .......... 257/685–686; 438/122, 126, 106, 108, 121, 124–127
See application file for complete search history.

(56) References Cited

U.S. PATENT DOCUMENTS

| 4,526,807 A | 7/1985 | Auerbach |
| 5,378,508 A | 1/1995 | Castro et al. |
| 6,787,242 B2 * | 9/2004 | Atzesdorfer et al. ........ 428/457 |
| 2003/0207114 A1 * | 11/2003 | Atzesdorfer et al. ........ 428/403 |
| 2004/0145044 A1 * | 7/2004 | Sugaya et al. ............... 257/698 |
| 2006/0076667 A1 | 4/2006 | Bachmaier et al. |
| 2006/0091522 A1 | 5/2006 | Bachmaier et al. |

FOREIGN PATENT DOCUMENTS

| EP | 1 462 907 A1 | 9/2004 |
| WO | WO 02/074027 A1 | 9/2002 |

OTHER PUBLICATIONS

Hüske, M, et al., "Laser Supported Activation and Additive Metallization of Thermoplastics for 3D-Mids", *Proceedings of the 3rd LANE Aug. 28-31, 2001, Erlangen Germany*.

* cited by examiner

*Primary Examiner*—Dao H Nguyen
*Assistant Examiner*—Tram H Nguyen
(74) *Attorney, Agent, or Firm*—Edell, Shapiro & Finnan, LLC

(57) ABSTRACT

A package for an electronic component includes a synthetic package compound. This synthetic package compound includes an upper outer contact on its upper side and a lower outer contact on its lower side, where the upper outer contact is electrically connected to the lower outer contact via a conduction path. The synthetic package compound includes a mixture of a plastic with filler particles. The conduction path is formed from free conducting metallic inclusions. The filler particles are provided with metallorganic compounds or inorganic complex compounds. The inclusions are formed by photolytic decomposition of the metallorganic compounds or inorganic complex compounds.

8 Claims, 3 Drawing Sheets

PACKAGE FOR AN ELECTRONIC COMPONENT AND METHOD FOR ITS PRODUCTION

CROSS REFERENCE TO RELATED APPLICATIONS

This application claims priority to German Application No. DE 10 2005 025 543.4, filed on Jun. 1, 2005, and titled "Package for an Electronic Component and Method for its Production," the entire contents of which are hereby incorporated by reference.

FIELD OF THE INVENTION

The invention relates to a package for an electronic component and to a method for its production.

BACKGROUND

German Patent Application DE 10 2004 049 663.3 discloses a package of a semiconductor component, in which lower outer contacts arranged on the lower side and upper outer contacts arranged on the upper side are connected together via conduction paths extending perpendicularly through the package. The conduction paths include free conducting inclusions of the synthetic material of the package.

The conduction paths are produced by first releasing the inclusions through input of energy; the conducting materials are subsequently amplified with a lower metal layer and a continuous metal layer is finally deposited on the inclusions by electrolytic coating. However, this process is elaborate and requires the additional process step for electrolytic deposition. Furthermore, the metallization often adheres deficiently on the plastic so that the conduction path does not conduct or has a very high impedance.

SUMMARY

The present invention provides a package having a reliable and low-impedance connection from the upper side to the lower side of a package. The invention further provides a method for generating through-contacts in packages, the method being less elaborate than conventional methods.

In accordance with the present invention, a package of an electronic component is provided that includes a synthetic package compound. A lower outer contact is applied on the lower side of this synthetic package compound, and an upper outer contact is applied on the upper side of the synthetic package compound. The lower outer contact and the upper outer contact are electrically connected together via a conduction path. The conduction path contains free conducting metallic inclusions. The invention may also be embodied with a multiplicity of upper and lower outer contacts and conduction paths.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
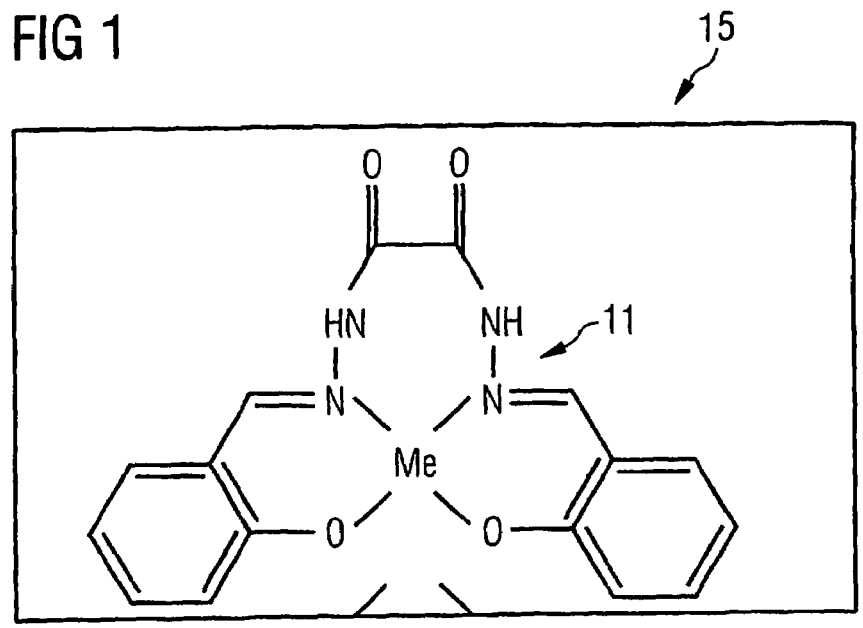
FIG. 1 is a structural formula of a metallorganic compound.

A package of an electronic component is provided in accordance with the invention. The package includes a synthetic package compound. A lower outer contact is applied on the lower side of this synthetic package compound, and an upper outer contact is applied on the upper side of the synthetic package compound. The lower outer contact and the upper outer contact are electrically connected together via a conduction path. The conduction path contains free conducting metallic inclusions. The invention may also be embodied with a multiplicity of upper and lower outer contacts and conduction paths.

In an embodiment of the invention, the material of the synthetic package compound is a mixture of a plastic and filler particles. The plastic may be a thermoset such as epoxy resin, or a thermoplastic such as liquid-crystalline polymer (LCP). The filler particle material is, for example, a ceramic such as BN, aluminum oxide ($Al_2O_3$) or silicon oxide. Filler particles are generally used to modify the thermal expansion coefficient of a package. Filler particles may be added to the plastic in a proportion of up to 90 percent by volume.

The filler particles are provided with metallorganic compounds or inorganic complex compounds. This is intended to mean that they are chemically bound to the metallorganic compounds or inorganic complex compounds.

The metallic inclusions are formed by photolytic decomposition of the metallorganic compounds or inorganic complex compounds. Here, photolysis is intended to mean the cleavage of a chemical bond by exposure to short-wavelength light, in particular using X-rays and short-wavelength UV rays. The wavelength is adapted to the strength of the bond to be broken. The exposure is preferably carried out using a laser. Individual regions of the package can thereby be deliberately exposed, and the amount of energy delivered can be controlled.

Since the metallorganic compounds or inorganic complex compounds are chemically bound to the filler particles, a large amount of metallic and inorganic material can be introduced into the package.

The bonding of the filler particles to the metallorganic compounds or inorganic complex compounds is photolytically broken by the exposure to a laser. The metals are then released as inclusions and thus form the electrical conduction paths. The metal layer adheres well on the background since the metal particles are bound to the filler.

The metallorganic compounds are preferably complex compounds. A complex compound is a structure in which a central atom, which has gaps in its electron configuration, is surrounded by one or more molecules or ions, so-called ligands, which respectively make at least one electron pair available for the bond. The use of complexes has the advantage that the metal atom can be released from the complex merely by a relatively small energy input.

In principle, the elements copper, nickel, palladium, cobalt, platinum, iridium, gold and silver can be the metals. Generally all transition metals that form stable complexes and compounds which cleave under intense short-wavelength exposure, in particular to a laser, are suitable. The bonding between the filler material and the metallorganic compounds preferably takes place via Si—C or Si—O bridges. Nevertheless, it may also exist in the form of chemisorption or physisorption.

In a preferred embodiment, the volume density of the filler particles in the package is more than 85 percent by volume. A multiplicity of metal atoms can thereby be introduced into the package, so that the conductivity of the electrical connection is improved.

In a preferred embodiment of the invention, the material of the package is optically transparent. The through-contact can therefore grow upward, starting from the lower side of the package, to the upper side of the package.

If the package according to the invention is used as a package for a semiconductor component, then a semiconductor component with contact through from its upper side to its lower side may be provided. Such a semiconductor component can be readily stacked without electrical lines needing to be provided on the sides of the semiconductor components. This increases the packing density of the semiconductor component.

The invention also relates to a method for producing a package including a synthetic package compound. This synthetic package compound contains a lower outer contact on a lower side of the package and an upper outer contact on an upper side. The lower and upper outer contacts are electrically connected. The method comprises the following steps. A synthetic material, which has been made from a mixture of a plastic with filler particles, is prepared first. The filler particles are chemically bound to metallorganic compounds or inorganic complex compounds. This compound exhibits the property that an electrically conducting metallic material is released by exposure to a laser.

A package for an electronic component is shaped from the synthetic material, and the package is then selectively exposed to a laser beam. It is exposed only when an electrical connection is to be made. The exposure produces electrically conducting material which forms a conduction path. This conduction path then constitutes a usable electrical connection.

One advantage of the method is that no further metallization process, such as electrolytic deposition, is necessary. This simplifies the process and reduces the production costs. Furthermore, the conducting inclusions adhere well on the background since they were initially bound to the filler material.

The conduction paths are preferably produced between the upper outer contact on the upper side and the lower outer contact on the lower side of the package. Semiconductor components are thereby produced which can be processed easily in a semiconductor component stack.

The invention is now described in further detail with reference to FIGS. 1-5.

FIG. 1 is a structural formula of a metallorganic compound 15, the metal ion being denoted by Me. In accordance with the invention, the metal can be copper, nickel, palladium, cobalt, platinum, iridium, gold and/or silver. In particular, metals Me that form stable metal complexes, cleavable under intense exposure, are suitable. The metals are then released by the exposure.

Figure 2:
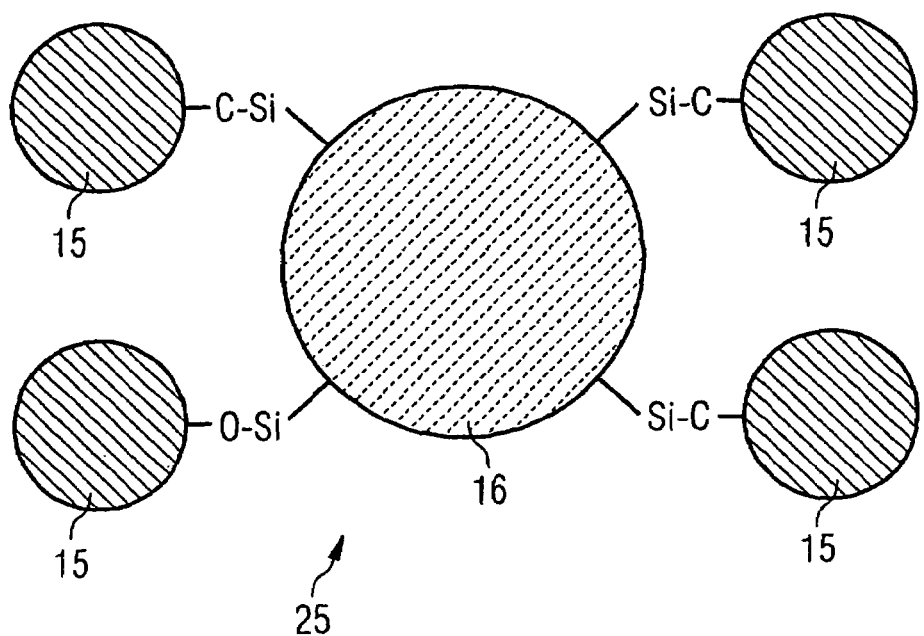
FIG. 2 structurally depicts the chemical composition of filler particles.

FIG. 2 illustrates the chemical composition of the filler particles. The filler particles contain ceramic filler material 16, which is chemically bound to the metallorganic compounds or inorganic metal compounds 15 via Si—C or Si—O bridges.

Figure 3:
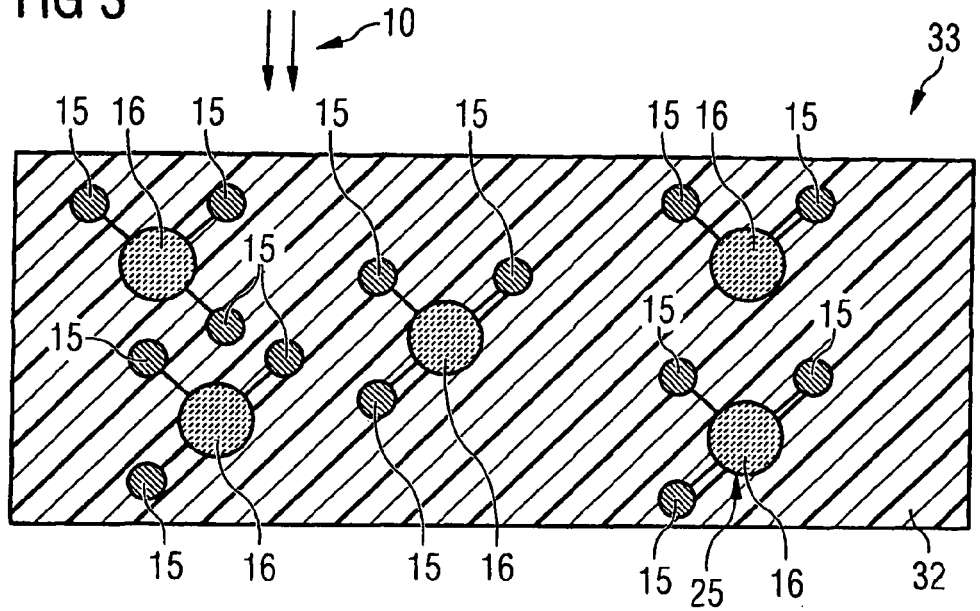
FIG. 3 structurally depicts a synthetic compound with inclusion material under exposure.

FIG. 3 shows an structural view of a synthetic compound 33 with filler particles 25 under the action of laser rays 10. The filler particles 25 are represented symbolically, as in FIG. 2, and do not necessarily represent the true structure of the included filler particles. FIG. 3 merely illustrates that the filler particles 25 are distributed separately from one another in the synthetic compound 33, and are respectively surrounded by plastic 32. The selective exposure is carried out using a laser beam 10.

Figure 4:
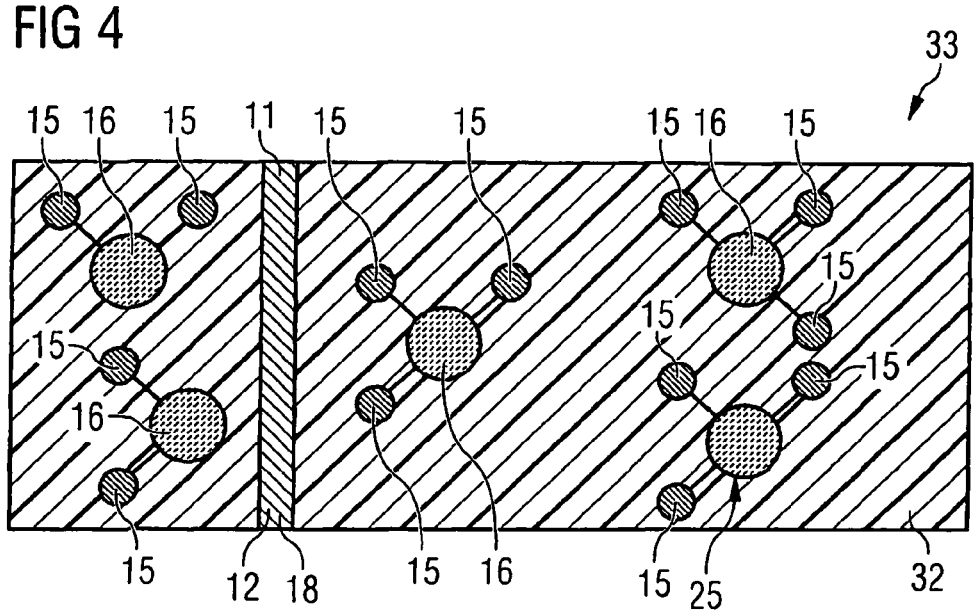
FIG. 4 structurally depicts a synthetic compound with inclusion material after exposure.

FIG. 4 shows the synthetic compound 33 after the exposure. The metallorganic complexes which were part of the two filler particles on the left have been cleaved by the laser exposure and now form a conduction path 18 of electrically conducting material perpendicularly from the upper side 7 to the lower side 9 of the package 21. An upper outer contact 11 has been formed on the upper side 7 and a lower outer contact 12 has been formed on the lower side 9.

Figure 5:
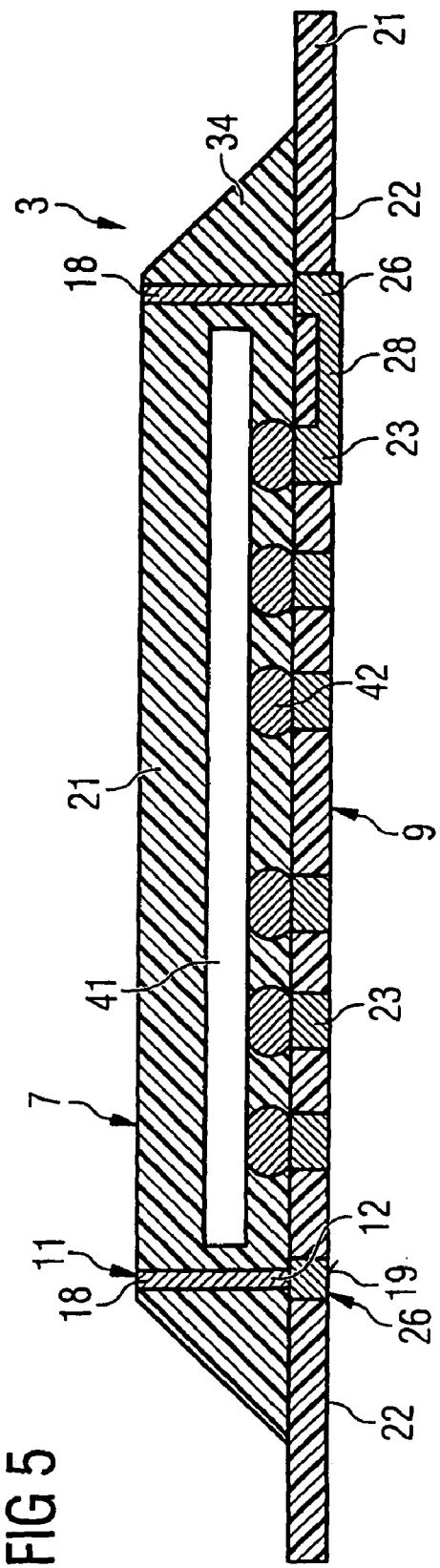
FIG. 5 schematically depicts a cross-section through a semiconductor component having a package which includes contacts through from its upper side to its lower side.

FIG. 5 is a schematic cross section through an electronic component 3 including a package 1. The package 1 contains a synthetic package compound 34, which encapsulates a semiconductor chip 41 with flip-chip contacts 42 on an interconnection substrate 21. The electronic component 3 is thus designed as a semiconductor component. The flip-chip contacts 42 of the semiconductor chip 41 are connected via inner contacts 23 through the interconnection substrate 21 to the lower outer contact surfaces 19 of the electronic component 3.

In its edge regions 22 which are likewise enclosed by the synthetic compound 33, the interconnection substrate 21 further includes outer through-contacts 26 lying outside the semiconductor chip 41. These through-contacts 26 are connected to the lower outer contacts 12 and thus via perpendicularly extending conduction paths 18 to the upper outer contacts 11 on the upper side 7 of the electronic component 3. The conduction paths 18 make it possible to stack semiconductor components 3 on one another.

The outer through-contact 26 on the right-hand side is connected to one of the inner through-contacts 23 via a metal cross connection 28, which extends level with the interconnection substrate 21. The synthetic package compound 34 contains compounds of filler material with metallorganic or inorganic metal compounds. The metals have been released from the bonding with the filler particles 25 by exposure to a laser beam 10, and thus form the perpendicular conduction paths 18.

Due to the usually very high filler density in the synthetic package compound used, the filler density being about 90 percent by volume, a continuous conductive connection is made. Because the metals have been introduced into the synthetic package compound 34 by the filler particles 25, no additional material needs to be added to the synthetic package compound 34. It is therefore not necessary to accommodate any modification of the material properties of the synthetic package compound 34, for example its thermal expansion coefficient.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A package for an electronic component including a synthetic package compound, the synthetic package compound comprising:

an upper outer contact on an upper side of the synthetic package compound;

a lower outer contact on a lower side of the synthetic package compound; and a conduction path that connects the upper outer contact to the lower outer contact;

wherein the synthetic package compound comprises a mixture of a plastic and filler particles chemically bound with metallorganic compounds or inorganic complex compounds, the conduction path is formed from electrically conducting metallic inclusions, and the inclusions are formed by photolytic decomposition of the metallorganic compounds or inorganic complex compounds.

2. The package of claim 1, wherein the filler particles are chemically bound with metallorganic compounds that are complex compounds.

3. The package of claim 1, wherein the package includes a volume density of the filler particles that is more than 85 percent by volume.

4. The package of claim 1, wherein at least a portion of the package is optically transparent.

5. A semiconductor component including the package of claim 1.

6. The package of claim 1, wherein the filler particles comprise ceramic particles.

7. The package of claim 1, wherein the metallorganic compounds or inorganic complex compounds are chemically bound with the filler particles via Si—C bonds or Si—O bonds.

8. The semiconductor component of claim 5, further comprising a semiconductor chip including electrical contacts that are embedded in the synthetic package compound.

* * * * *